United States Patent
Nagarajan et al.

(10) Patent No.: US 6,846,725 B2
(45) Date of Patent: Jan. 25, 2005

(54) WAFER-LEVEL PACKAGE FOR MICRO-ELECTRO-MECHANICAL SYSTEMS

(75) Inventors: Ranganathan Nagarajan, Singapore (SG); Chirayarikathuveedu Sankarapillai Premachandran, Singapore (SG); Yu Chen, Singapore (SG); Vaidyanathan Kripesh, Singapore (SG)

(73) Assignee: Institute of Microelectronics, Singapore (SG)

( * ) Notice: Subject to any disclaimer, the term of this patent is extended or adjusted under 35 U.S.C. 154(b) by 37 days.

(21) Appl. No.: 10/351,534

(22) Filed: Jan. 27, 2003

(65) Prior Publication Data
US 2004/0077154 A1 Apr. 22, 2004

(30) Foreign Application Priority Data
Oct. 17, 2002 (SG) .......................................... 200206388

(51) Int. Cl.[7] .......................... H01L 21/30; H01L 21/46
(52) U.S. Cl. ....................................................... 438/456
(58) Field of Search ................................ 438/455, 456, 438/106

(56) References Cited

U.S. PATENT DOCUMENTS

| 5,448,014 A | * 9/1995 | Kong et al. ................. 174/52.3 |
| 6,228,675 B1 | * 5/2001 | Ruby et al. .................. 438/106 |
| 6,498,422 B1 | * 12/2002 | Hori ........................... 310/344 |

OTHER PUBLICATIONS

T. Nguyen Nhu et al.: "Through–Wafer Copper Plugs Formation for 3–Dimentional ICs", DIMES, The Netherlands, pp. 141–144.
N. T. Nguyen et al.: "Through–wafer copper electroplating for three–dimensional interconnects", Jun. 19, 2002, J. Micromech. Microeng. 12 (2002), pp. 395–399.

\* cited by examiner

Primary Examiner—David A. Zarneke
(74) Attorney, Agent, or Firm—Nath & Associates PLLC; Harold L. Novick; Marvin C. Berkowitz

(57) ABSTRACT

A method for forming wafers having through-wafer vias for wafer-level packaging of devices, the method comprising the steps of depositing metal on one of two wafers; bonding the two wafers using the metal deposited on the one of the two wafers; forming a through-wafer via in one of the two wafers; filling the through-wafer via with a conductive material; and forming a cavity in the one of the two wafers having the through-wafer via wherein the cavity is superposable over a device.

18 Claims, 13 Drawing Sheets

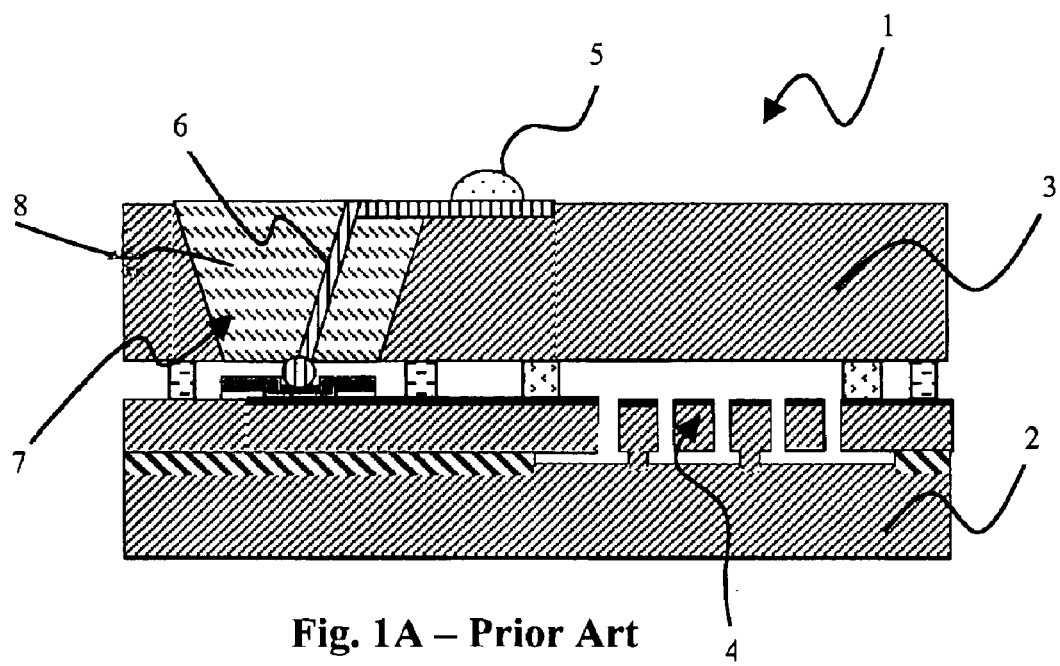
Fig. 1A – Prior Art
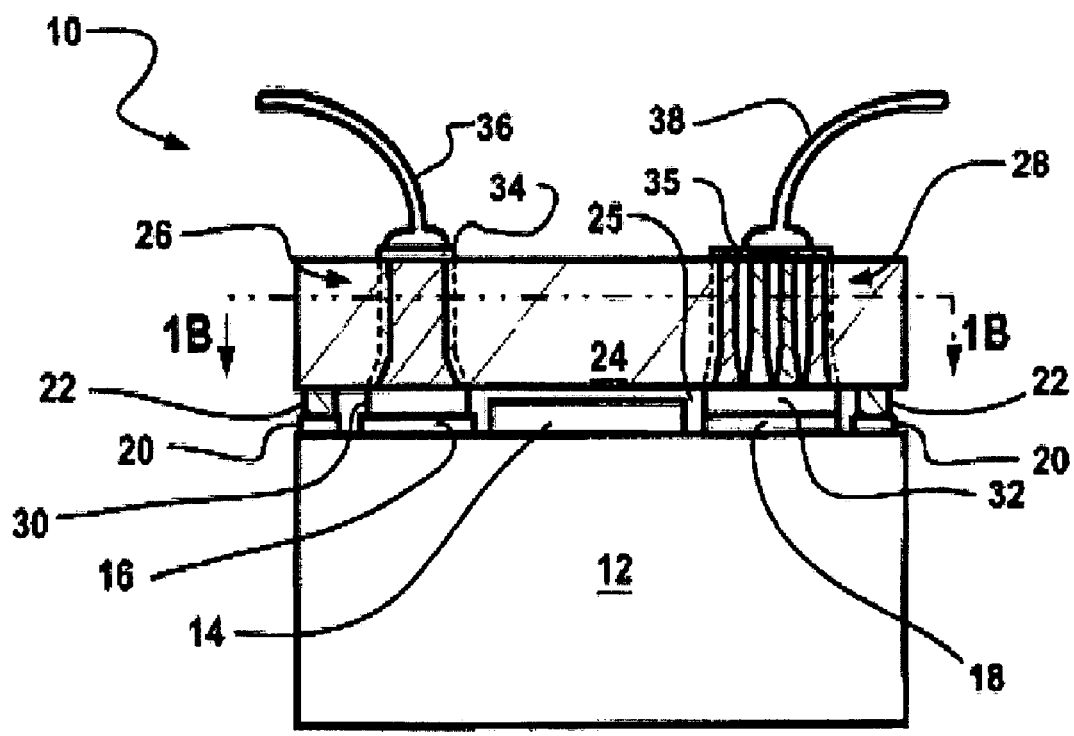
Fig. 1B – Prior Art

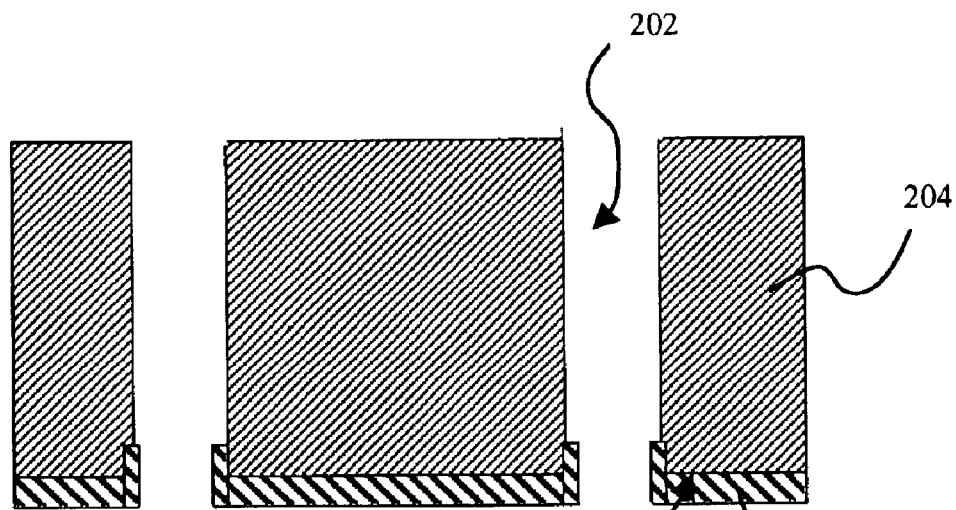
Fig. 2A – Prior Art
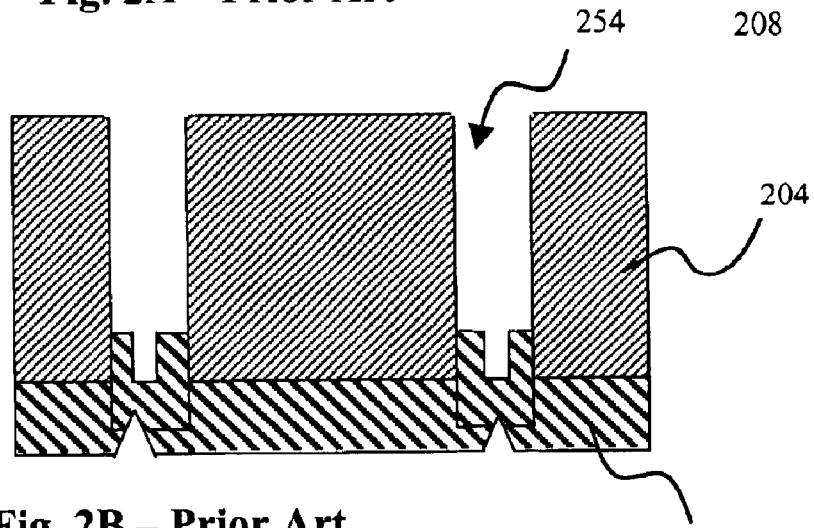
Fig. 2B – Prior Art
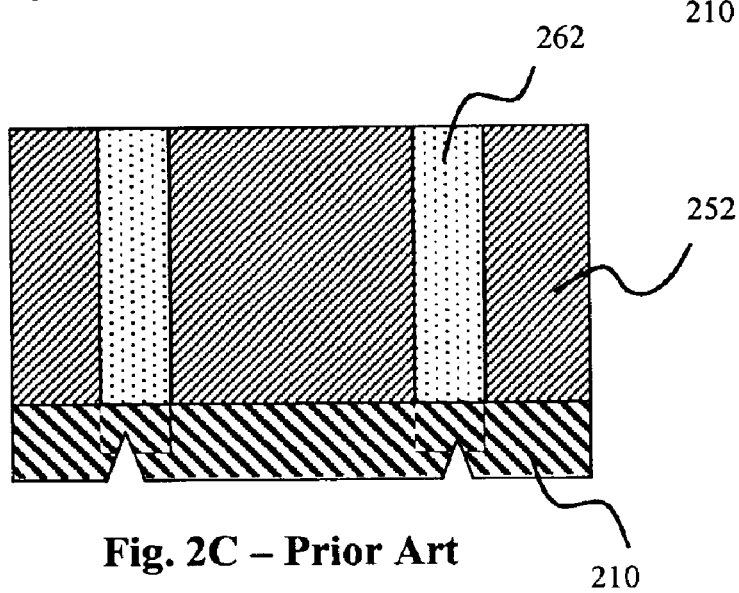
Fig. 2C – Prior Art

WAFER-LEVEL PACKAGE FOR MICRO-ELECTRO-MECHANICAL SYSTEMS

FIELD OF INVENTION

The invention relates generally to wafer-level packaging. More particularly, the invention relates to wafer-level packaging for micro-devices containing Micro-Electro-Mechanical Systems.

BACKGROUND

Micro-Electro-Mechanical Systems or MEMS are typically the integration of mechanical elements, sensors, actuators and electronics on a common silicon substrate such as a wafer through the utilization of micro-fabrication technologies. MEMS are envisaged to revolutionise nearly every micro-device product category by bringing together silicon-based microelectronics with micromachining technologies. In this way, MEMS make possible the realisation of the concept of complete systems-on-a-chip. Hence, the commercial potential of MEMS devices is practically boundless in the current marketplace.

However, extensive MEMS commercialisation is currently hampered due to the attendant difficulties of packaging these micro-devices and the high cost involved in packaging and testing the micro-devices. The cost of packaging and testing such micro-devices can be up to ten times more expensive than the cost of manufacturing the micro-devices. The much sought after technological breakthrough that is anticipated to drive MEMS commercialisation is packaging technologies for MEMS. This is because the process of packaging MEMS affects not only the micro-device size and cost, but also is the most unreliable step and the bottleneck in achieving high performance for MEMS. For the successful commercialisation of the highly innovative MEMS devices, the importance of MEMS packaging and conjunctively used carriers must be addressed and realised at the early design cycles of MEMS.

Although MEMS fabrication technologies apply a number of processes similar to integrated circuit (IC) fabrication technologies, MEMS packaging technologies are substantially different and more challenging than IC packaging technologies. MEMS packaging technologies need to satisfy a number of requirements relating to adequate mechanical protection for moving structures and thin membranes in the MEMS devices from environmental contamination, vibration and etc; interaction with environment for sensing and actuating; support for electrical power and signals such as low lead inductance, capacitance and resistance; good heat dissipation; manufacturability suitable for integration into Wafer-Level Packaging (WLP) processes; reliability; and economical or cost effective.

The reliability of MEMS depends on packaging type, materials, wafer-level processes and sealing methods used for environmental protection employing micro-device caps or microcaps. The development process of MEMS package and packaging process is the single most expensive and time-consuming process in the entire MEMS product development cycle. This difficulty stems from the fact that MEMS packaging is typically applied to Application Specific MEMS Packages (ASMP), thus making MEMS packaging difficult to develop for generic applications.

Currently, most development efforts for MEMS packaging result in new and specialised packaging every time a new MEMS device is fabricated. Even the packaging of one of most popular mass-produced MEMS devices, the accelerometer, involves specific packaging strategies that are dependent on different manufacturers.

Thus, generic and modular ways of designing MEMS packaging are desirable and can significantly reduce the total cost of MEMS as well as save time and effort during early design cycles for MEMS. However, it is often easy to neglect considering the packaging aspect of MEMS fabrication when designing MEMS devices. The packaging strategy for MEMS, however, must be considered right from the beginning of the product development and fabrication of MEMS. For most MEMS devices, hermetic packaging is the desired form of packaging. Perfect hermetic packaging has good reliability, but achieving this ideal requisite is very expensive and challenging.

A number of MEMS packages are currently fabricated using Wafer-Level Packaging (WLP) technologies. MEMS packages can also be chip-scale packages, which are device packages that allow devices to be attached to device carriers or printed circuit boards (PCB) face-down with the devices' pads connecting to the carriers or PCBs through individual balls of solder. WLP is a packaging technology performed at the wafer level that requires the bonding of two or more wafers before singulation or dicing of the bonded wafers to obtain the individual devices that are already packaged. WLP is a powerful concept that can bring the total production cost of micro-devices significantly down. Although each WLP processing step tends to be more costly than conventional post-singulation packaging processes, the cost is divided among all the devices on a wafer.

Typical wafer-level interconnection structures use layers of polymer dielectric systems and a thin metal film redistribution layer. Ultimately, to achieve high I/O density, electrical power distribution by using through-wafer vias is necessary, especially for space-efficient applications. The wire bonding technique is a popular technique for providing electrical interconnection, such as that employed in a conventional MEMS device 1 shown in FIG. 1A, in which a MEMS wafer 2 is bonded to a cap wafer 3 and a MEMS device 4 on the MEMS wafer 2 is connected to a solder ball 5 through a wire bond 6 which is held in a via 7 using an epoxy material 8. The wire bonding technique has limited application in MEMS packaging. For example, ultra sonic energy applied in the frequency range between 50 and 100 kHz for performing wire bonding may stimulate the oscillation of the suspended mechanical structure of the MEMS device 4. This is because most MEMS devices have resonant frequency in the foregoing frequency range, thereby increasing the risk of failure during wire bonding.

Through-wafer vias are typically intended for providing interconnects between both sides of wafers with which micro-devices are fabricated using WLP. Current packaging trend shows that vertical interconnects are favoured because of space efficiency and design simplicity, leading to the increased popularity of WLP devices. For example, array sizes of devices for input/output (I/O) are limited when electrical connections are, found at the periphery of the devices, primarily due to limited space along the edges of the devices for I/O leads. This limitation necessitates the use of through-wafer interconnects for micro-devices.

Also, achieving low parasitic capacitance and impedance is critical for MEMS devices that are used in RF applications. Research has been conducted for making these through-wafer vias conductive with low capacitance for such RF applications. Deep-wafer etching has also been widely studied in MEMS technology because obtaining high density and high aspect ratio through-wafer vias is critical for optimising for integration and final device performance. The most two popular deep-wafer etching processes are Bosch and Cryo process.

A number of wafer-to-wafer bonding techniques have been developed for packaging micro-devices to achieve hermetic sealing. These techniques include silicon-to-glass anodic bonding, silicon-to-silicon fusion bonding, and wafer-to-wafer bonding using various intermediate materials as bonding media. Connections to a hermetically sealed micro-device are generally made under the bonding media against one of the wafers or through one of the wafer. Based on the foregoing preferences for vertical connections, through-wafer vias are thus favoured where hermetic sealing of micro-devices is an attendant requirement.

One of the solutions for MEMS packaging can be to use electrically conductive through-wafer vias. These vias can be connected to metal conductors that connect to bond pads of the MEMS device. Such vias have advantages for space improvement and efficiency, and can be fabricated in a high volume-manufacturing method using bulk micromachining. For low I/O count devices, this method can be used without difficulty. For high I/O count micro-devices, however, this option can be a technical challenge.

In U.S. Pat. No. 6,228,675 granted to Ruby et al, with reference to FIG. 1B, a method of fabricating a microcap 10 with vias 26/28 defined on a cap wafer 24 is proposed. The vias 26/28 are initially etched as trenches or wells and are filled by a conductive material from the top or the side of the cap wafer 24 having the trenches before the cap wafer 24 is bonded with a MEMS device wafer 12 to provide hermetic sealing. The cap wafer 24 is later thinned by backgrinding the non-trench side of the cap wafer 24 to expose the conductive vias 26/28. The main limitation in such a proposal is that it provides for forming conductive vias 26/28 that are made of semiconductor materials like Polysilicon, III–V materials or etc, which results in higher series resistance due to conductive vias than metallized vias. This approach only works for trenches with narrow openings (<10 um) but not for trenches with larger openings because a proportionately thicker conductive material needs to be deposited to fill-up the vias before subsequent process steps are performed. This further results in excessive material build-up that induces very high film stress in the cap wafer, from which the microcap 10 is formed, which is susceptible to breakage due to deep vias that are already formed in the cap wafer. Additionally, by such a proposed method it is not possible to fill very deep trenches, as it is very difficult to obtain a conforming semi-conductor dopant layer. From the foregoing problems, it is apparent that there is a need to provide an alternative to the conventional wafer-level packaging for micro-devices.

In an article entitled "Through-Wafer Copper Plugs Formation For 3-Dimensional ICs" by T. Nguyen et al, DIMES Netherlands, a method for forming high aspect ratio conductive through-wafer vias 202 in a wafer 204 by forming seed metal layers and applying a "bottom-up" approach for filling the through-wafer vias 202 in thin wafers is proposed. The bottom-up approach involves forming the through-wafer vias 202 and then filling these vias 202 which are blocked on one side 206 of the wafer 204 by a thin seed metal layer 208 that is deposited by an evaporation process and subsequently thickened to a thick seed metal layer 210 by using a thick electroplating process. This proposed method thus requires two seed metal laying processes, thereby making it an expensive process. Also, the thick seed metal layer 210 needs to be removed by backgrinding/CMP process. A limitation of this proposed method of forming through-wafer vias by performing double seed metal laying processes is that it is suitable only for shallow through-wafer vias (<150 um) with narrow openings (<5 um). This is because it takes a longer time to fill the through-wafer vias by evaporation and electroplating. In cases where larger vias (>5 um) are used, a very thick electroplated metal is formed on one side by the time the via openings are fully closed. The thick metal thus formed induces high stress on the wafer 204 and may cause the wafer 204 to crack. Also the cost of this proposed method is much higher due to double seed layer process and backgrinding or CMP for removing the excess seed metal after electroplating. Additionally, such a method requires the handling of thin wafers by a wafer-bonding machine, which can be a problem since thin wafers have more structural liabilities.

In another article entitled "Through-Wafer Copper Electroplating For 3-Dimensional ICs" by T. Nguyen et al, DIMES Netherlands, Institute Of Physics Publishing, Journal Of Micromechanics And Microengineering, a further method is proposed using wafer-to-wafer bonding with a photoresist layer as a bonding material to form through-wafer vias in a wafer. The wafer with the through-wafer vias is first bonded to another wafer with a seed metal layer using the photoresist layer sandwiched between the seed metal layer and the wafer with the through-wafer vias. The photoresist layer exposed by the through-wafer vias is then subjected to exposure and development through the through-wafer vias to form seed areas. Once the seed areas are formed, electroplating is performed to fill the through-wafer vias using these seed areas. A limitation of this proposed method is the attendant difficulty to perform wafer-to-wafer bonding effectively using the photoresist layer without having enough solvent content to keep the photoresist layer soft. Also, the exposure and development of the seed areas performed through the deep through-wafer vias is not effectively performed as the developer cannot clear the photoresist exposed by through-wafer vias which are deep (>100 um). Even after a very long exposure time (5 min) and after development is performed on the photoresist layer, photoresist residuals are reportedly left in the through-wafer vias. By using an ultrasonic bath during development, the seed areas in large vias (>50×50$\mu$m2) may be opened, but damage to the seed metal layer due to ultrasonic force is observed. Additionally, the separation of the bonded wafers is not an easy task as the through-wafer via fill materials in the first wafer are attached to the seed metal layer on the second wafer. Furthermore, if the two wafers are to be separated by a backgrinding process, the two wafers may not have sufficient bond strength to withstand the shear force applied during the backgrinding process since the photoresist layer is not inherently suitable for bonding the two wafers.

From the foregoing problems, it is apparent that there is a need to provide an alternative to the conventional wafer-level packaging for micro-devices.

SUMMARY

A wafer-level MEMS package and method therefore are provided hereinafter wherein a MEMS device is connected to bonding pads on a MEMS wafer. A peripheral pattern is patterned along with the bonding pads on the MEMS wafer to encompass the bonding pads and the MEMS device. In one instance, a cap wafer is processed to form through-wafer vias in the cap wafer using an etching process. A metal layer is uniformly deposited on a sacrificial wafer that is bonded to the cap wafer and removed after the etching process. In another instance, the metal layer is uniformly deposited on the cap wafer before the via-etching process to serve as an etch-stop layer in an etching process. The cap wafer is formed in a way such that the through-wafer vias can be aligned with the bond pads of the MEMS wafer. In both instances the metal layer serves as a seed metal. By means of an electroplating process and using the seed metal, the through-wafer vias are filled with a conductive material. The metal layer can also be an Under-Bump Metal (UBM) layer, which can be patterned to form bond pads and a peripheral pattern congruous with the corresponding bonding pads and peripheral pattern on the MEMS wafer for providing interconnection between the two wafers and a gasket for providing hermetic sealing, respectively. The two wafers are then aligned and eutectically bonded to form a wafer stack. In a further instance, the bonding of the two wafers is performed before the via-etching process, which then requires electroless plating of the through-wafer vias after etching. The side of the cap wafer with the through-wafer vias exposed is now metallized with a UBM layer from which bond pads are patterned. Solder patterns are formed on the bond pads by conventional methods like screen printing or solder film deposition, lithography and etch before the wafer stack is finally singulated to form a surface mountable wafer-level MEMS package.

In accordance with a first aspect of the invention, there is provided hereinafter a method for forming wafers having through-wafer vias for forming interconnects for wafer-level packaging of devices, the method comprising the steps of depositing a metal layer on one of a first wafer and a second wafer; bonding the first wafer and the second wafer using the metal layer deposited on one of the first wafer and the second wafer; forming a through-wafer via in one of the first wafer and the second wafer; filling the through-wafer via with a conductive material; and forming a cavity in the one of the first wafer and the second wafer having the through-wafer via wherein the cavity is superposable over a device, wherein the conductive material first fills by one of electroplating and electroless plating the through-wafer via at the side of the one of the two wafers having the through-wafer via to which the other of the one of the two wafers is bondable

BRIEF DESCRIPTION OF DRAWINGS

Embodiments of the invention are described hereinafter in detail with reference to the drawings, in which:

FIGS. 1A and 1B is an illustration of prior art wafer-level packages;

FIGS. 2A to 2C provide an illustration of another prior art process of forming vias in a cap wafer during wafer-level packaging;

DETAILED DESCRIPTION

Figure 3A:
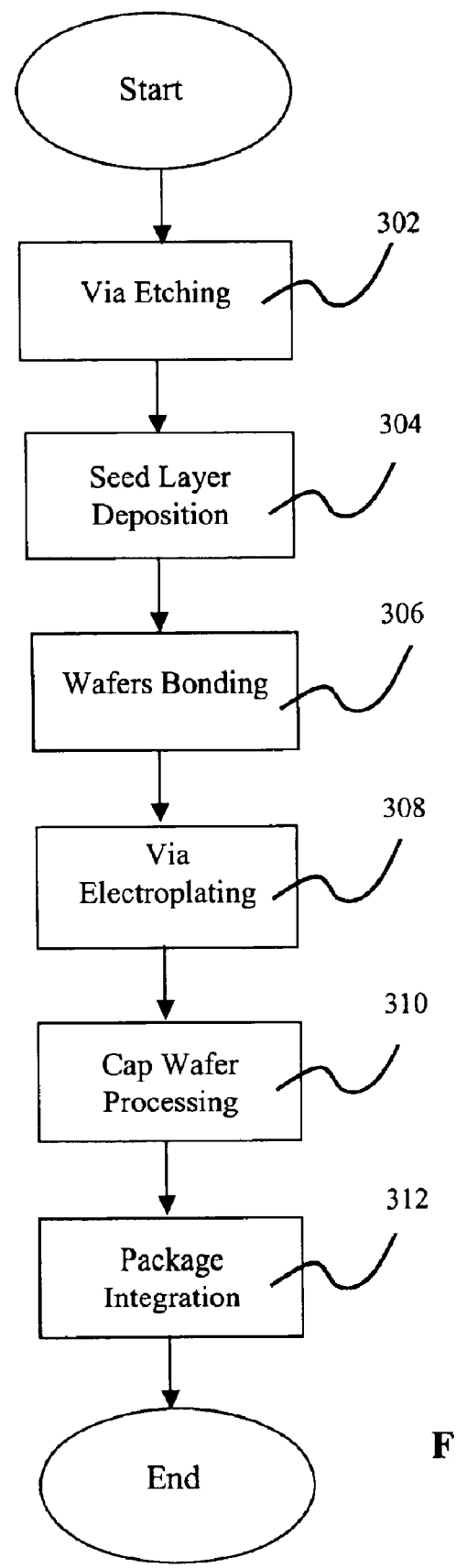
FIGS. 3A to 3G are diagrams illustrating a method for wafer-level packaging and a device formed therefrom according to embodiments of the invention.
Figure 3B:
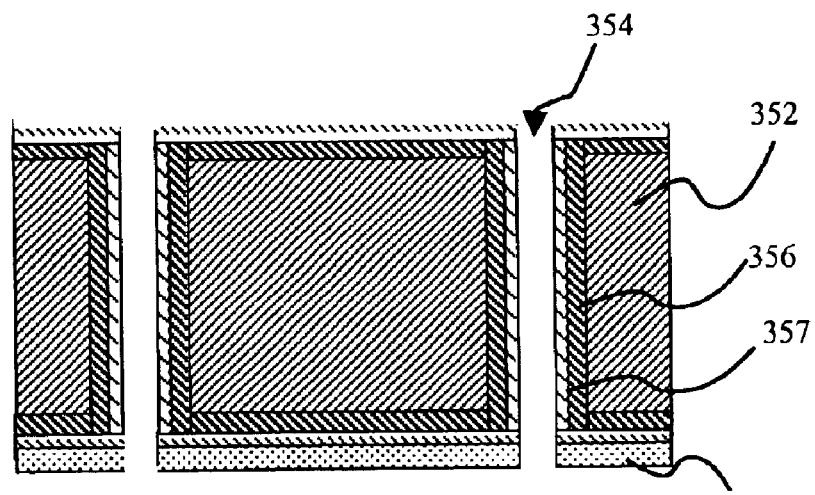
Figure 3C:
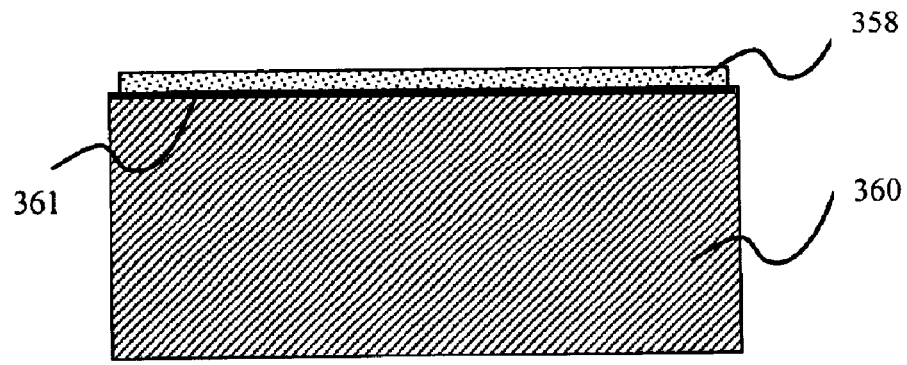
Figure 3D:
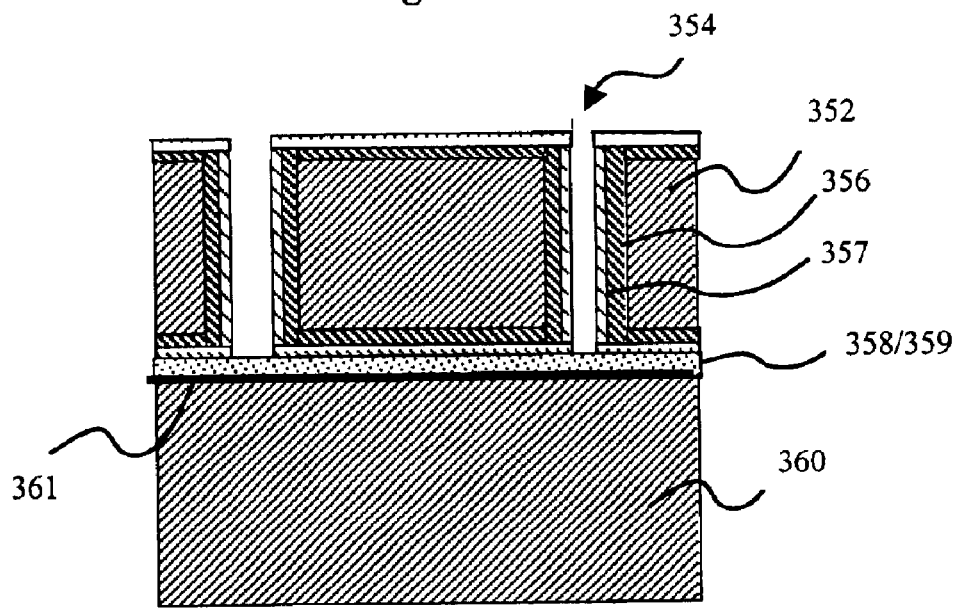
Figure 3E:
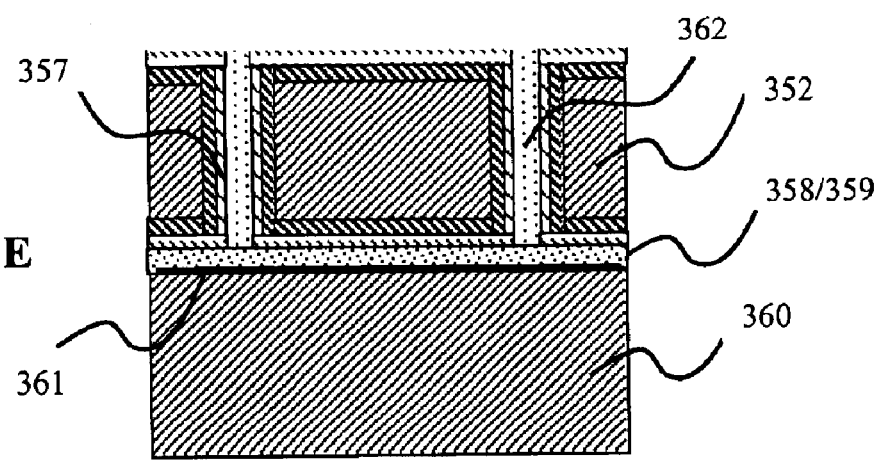
Figure 3F:
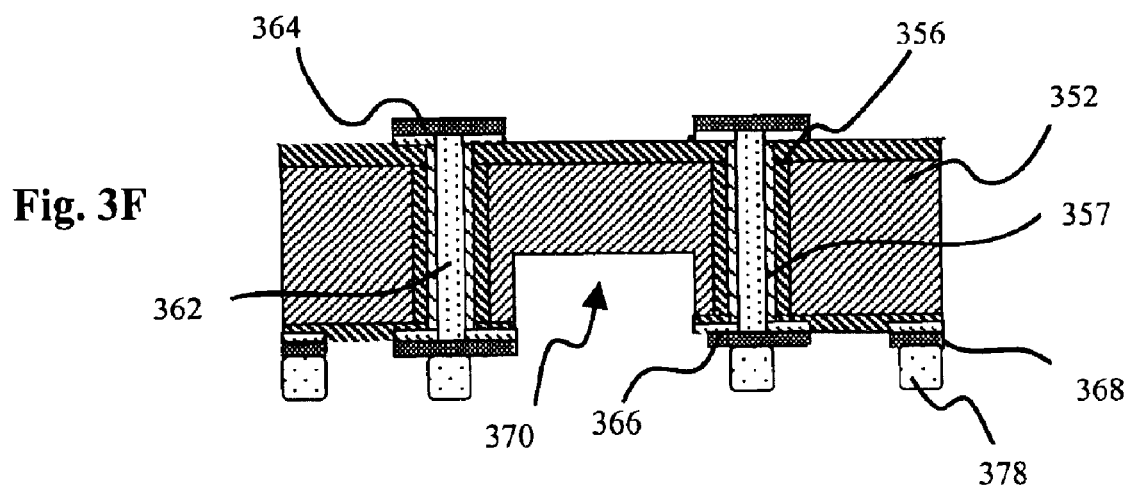
Figure 3G:
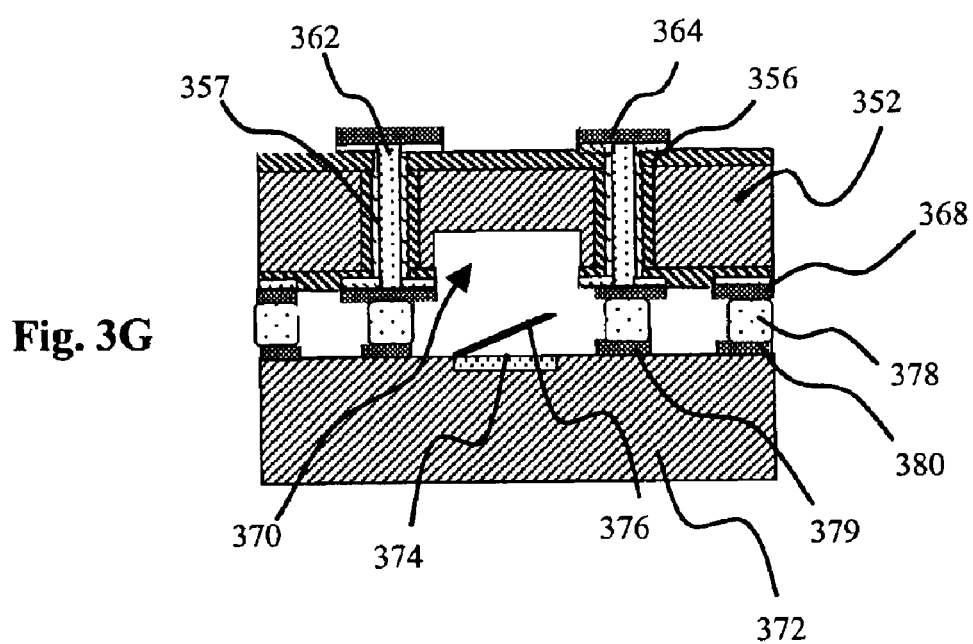

Embodiments of the invention are described hereinafter for addressing the foregoing need to provide an alternative to conventional wafer-level packaging for micro-devices.

In accordance with embodiments of the invention, wafer-level MEMS packaging methods and wafer-level MEMS packages are described. In the embodiments, a MEMS device is connected to bonding pads on a MEMS wafer. A peripheral pattern is patterned along with the bonding pads on the MEMS wafer to encompass the bonding pads and the MEMS device. In some embodiments, a cap wafer is processed to form through-wafer vias in the cap wafer using an etching process. A metal layer is uniformly deposited on a sacrificial wafer that is bonded to the cap wafer and removed after the etching process. In other embodiments, the metal layer is uniformly deposited on the cap wafer before the via-etching process to serve as an etch-stop layer in an etching process. The cap wafer is formed in a way such that the through-wafer vias can be aligned with the bond pads of the MEMS wafer. In the foregoing embodiments the metal layer serves as a seed metal. By means of an electroplating process and using the seed metal, the through-wafer vias are filled with a conductive material. The metal layer can also be an Under-Bump Metal (UBM) layer, which can be patterned to form bond pads and a peripheral pattern congruous with the corresponding bonding pads and peripheral pattern on the MEMS wafer for providing interconnection between the two wafers and a gasket for providing hermetic sealing, respectively. The two wafers are then aligned and eutectically bonded to form a wafer stack. In further embodiments, the bonding of the two wafers is performed before the via-etching process, which then requires electroless plating of the through-wafer vias after etching. The side of the cap wafer with the through-wafer vias exposed is now metallized with a UBM layer from which bond pads are patterned. Solder bumps are placed on the bond pads before the wafer stack is finally singulated to form a surface mountable wafer-level MEMS package.

By these embodiments, a wafer-level MEMS package can be achieved with >400 um through-wafer vias in the microcap of the MEMS package. This is attributed to deep through-wafer via filling processes described hereinafter.

There are a number of attendant advantages to the embodiments of the invention, in which one relates to the filling of conductive material in the through-wafer vias using the bottom-up approach which requires minimum process steps of seed layer deposition, through-wafer via etching, electroplating and UBM patterning. Another advantage relates to the combination of the process of forming solder bumps and through-wafer via for providing interconnects through the electroplating process by switching the electroplating solution and/or process. A further advantage relates to the formation of plated through-wafer vias by bonding two wafers with seed metal sandwiched between the two wafers. This provides numerous possibilities for MEMS packaging for forming high-density MEMS packages. A yet further advantage relates to the high conductivity through-wafer vias for use in RF applications in which copper vias are appropriately used. A still further advantage relates to the reduction of the size of the MEMS package to a chip-scale MEMS package. An even further advantage relates to the absence of wafer thinning processes after the through-wafer vias are filled with conductive material.

With reference to FIGS. 3A to 3G, embodiments of the invention are described for a wafer-level MEMS packaging method and a wafer-level MEMS package. With reference to FIG. 3A, the wafer-level MEMS packaging method is described while with reference to FIGS. 3B to 3G, the processing of the wafer-level MEMS package is described. In a Via Etching step 302, a cap wafer 352 is processed in which through-wafer vias 354 are etched using conventional etching process including DRIE or the like etching processes. A barrier layer 356/357, for example comprising a suitable silicon oxide barrier 356 and/or a metal barrier 357 like Titanium or Tantalum, depending on the application and specific requirement, is then formed at the interface between the cap wafer 352 and the fill material for the through-wafer vias 354 using conventional barrier deposition or lithography and etching processes. The oxide barrier 356 provides insulation while the metal barrier 357 provides adhesion between the fill material and the through-wafer vias 354 and prevents diffusion of the fill material into the cap wafer 352. A seed film 359 can also be deposited on the side of the cap wafer 352 to be bonded with another wafer for facilitating improved bonding between the two wafers. In this case, the presence of the metal barrier 357 also provides adhesion between the cap wafer 352 and the seed film 359. Though the aspect ratio of the through-wafer vias 354 can be high (>10) and the depth of the through-wafer vias 354, and thus the thickness of the cap wafer 352, can be >400 um, this does not limit the application of the embodiments of the invention to cap wafers and through-wafer vias of other dimensions.

In a next Seed Layer Deposition step 304, a seed layer 358 is deposited on a sacrificial wafer 360. The seed layer 358 can be a metal such as gold (Au) or copper (Cu), which also acts as a bonding layer for thermocompression or the like compression process. Before the seed layer 358 is deposited on the sacrificial wafer 360, a metal barrier 359 comprising of Titanium or Tantalum can be deposited on the sacrificial wafer 360 for providing adhesion between the seed layer 358 and the sacrificial wafer 360. Then in a Wafers Bonding step 306 thermocompression or the like compression process is applied to the cap wafer 352 and the sacrificial wafer 360 with the seed layer 358 sandwiched therebetween. Conventional thermocompression settings optimised for the proper bonding of the two wafers are preferably used in this case.

As an alternative, the Via Etching step 302 may be performed after the Seed Layer Deposition step 304 and the Wafers Bonding step 306. In this case, the seed layer 358 also acts as an etch-stop layer at which the etching of the through-wafer vias 354 stop.

In a subsequent Via Electroplating step 308, an electroplating process with the seed layer 358 acting as the electroplate is performed in which an electrolyte such as copper sulphate or the like electrolyte fills the through-wafer vias 354. After electroplating, a conductive material 362, such as copper (Cu), gold (Au) or nickel (Ni), is left to fill the through-wafer vias 354 forming vertical interconnects. The barrier layer 356/357 acts as a barrier preventing transmigration or diffusion of the conductive material 362 into the cap wafer 352.

After electroplating, in a Cap Wafer Processing step 310, the sacrificial wafer 360 is removed by conventional processes such as backgrinding and/or polishing. The seed layer 358 is also removed by the same backgrinding and/or polishing processes, thereby exposing the conductive material 362. The side of the cap wafer 352 opposite the seed layer 358 is also backgrinded and/or polished to expose the conductive material 362. Thereafter, UBM layers are deposited on both sides of the cap wafer 352 and patterned to form interconnect pads 364 and 366, which are electrically interconnected via the conductive material 362, and bond pads 368 to facilitate bonding and stacking the cap wafer 352 with a wafer containing a MEMS device. The deposition and patterning of the UBM layers are performed using conventional techniques, which are followed by the etching of a MEMS cavity 370 on the same side of the cap wafer 352 having the bond pads 368.

In a Package Integration step 312, the cap wafer 352 is solder bonded to a MEMS wafer 372 having a MEMS device 374 with a movable structure 376 using solder patterns 378, which are formed by conventional processes such as screen printing or lithography and etch, to form a wafer stack. Signals and electrical supply to the MEMS device 374 are conveyed to the MEMS device 374 via MEMS pads 379 formed on the MEMS wafer 372, which are congruent with and connected to the interconnect pads 366 on the cap wafer 352 using the solder patterns 378 on the cap wafer 352. Similarly, bond pads 380 formed on the MEMS wafer 372 are also congruent with and connected to the bond pads 368 formed on the cap wafer 352. Most importantly, the MEMS cavity 370 is congruent with the MEMS device 374 when superposed over the MEMS device 374 so that the movement of the movable structure 376 is unimpeded within the MEMS cavity 370. Alternatively, the cap wafer 352 may be bonded to the MEMS wafer 372 using a bonding material such as metal or solder suitable for thermocompression or the like compression processes instead of the solder patterns 378. To complete the wafer-level MEMS package, solder bumps are applied to the interconnect pads 364 by conventional processes such as screen printing or lithography and etch, and the wafer stack singulated. Alternatively, the solder bumps may be formed directly in place of the interconnect pads 364 formed during the Cap Wafer Processing step 310 by switching the electroplating solution and/or process after the electroplating process in the Via Electroplating step 308 to appropriately apply the solder bumps.

Figure 4A:
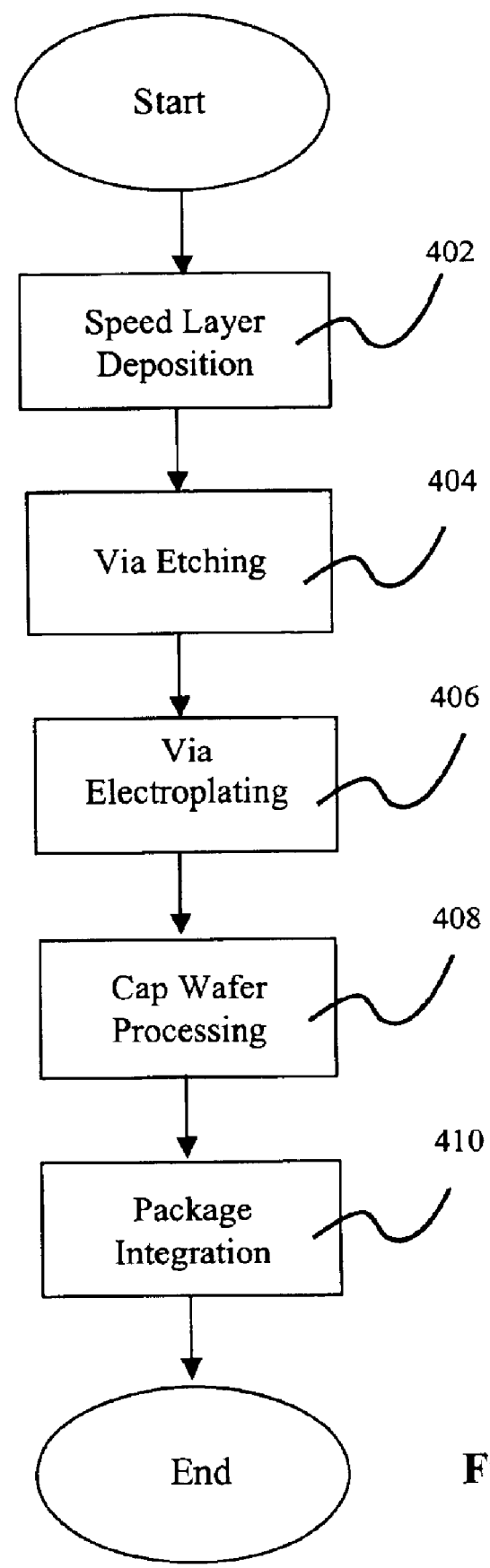
FIGS. 4A to 4F are diagrams illustrating another method for wafer-level packaging and a device formed therefrom according to other embodiments of the invention.
Figure 4B:
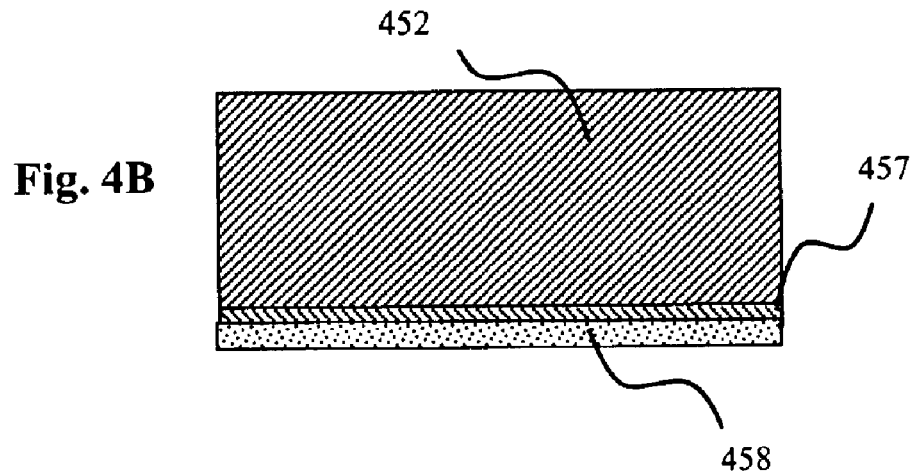
Figure 4C:
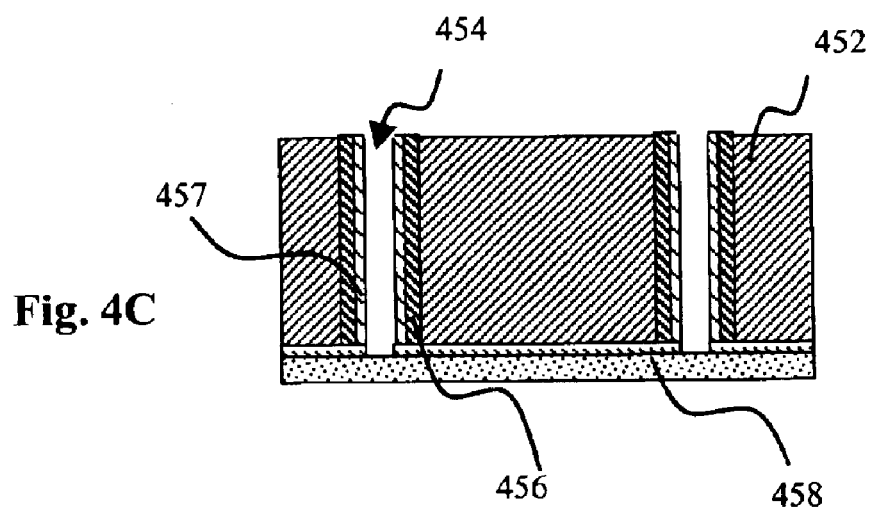
Figure 4D:
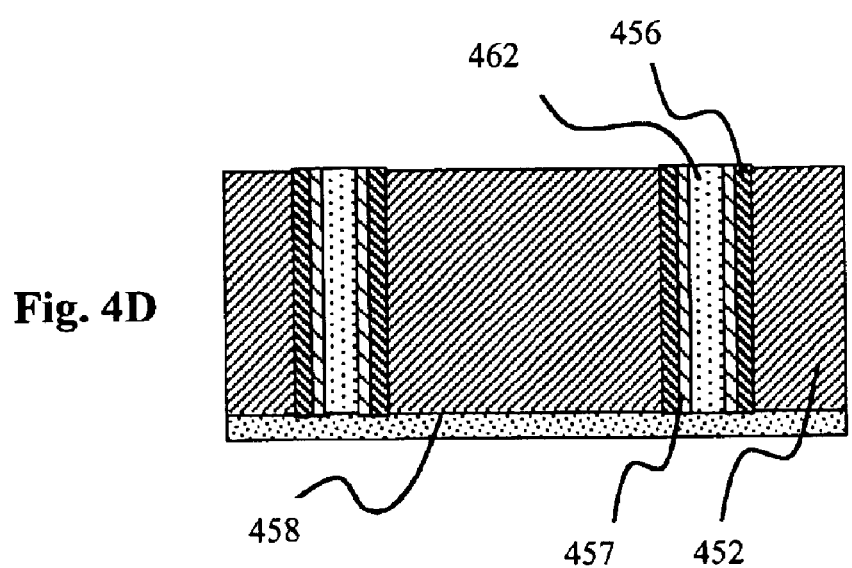
Figure 4E:
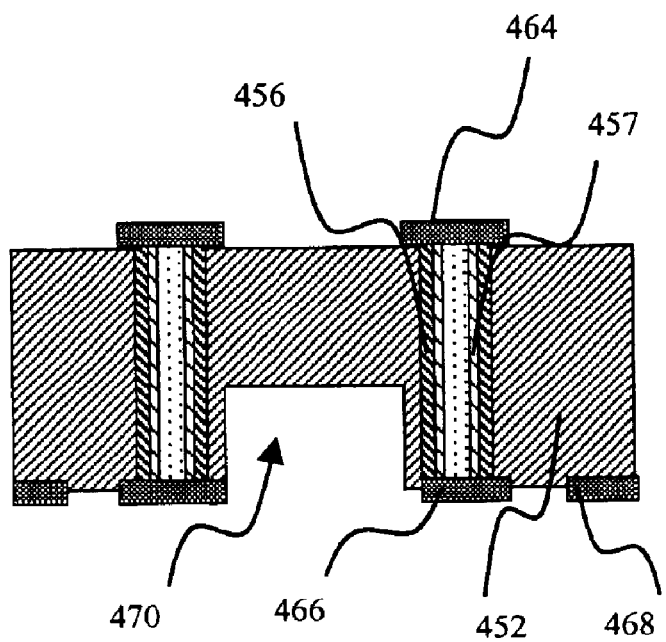
Figure 4F:
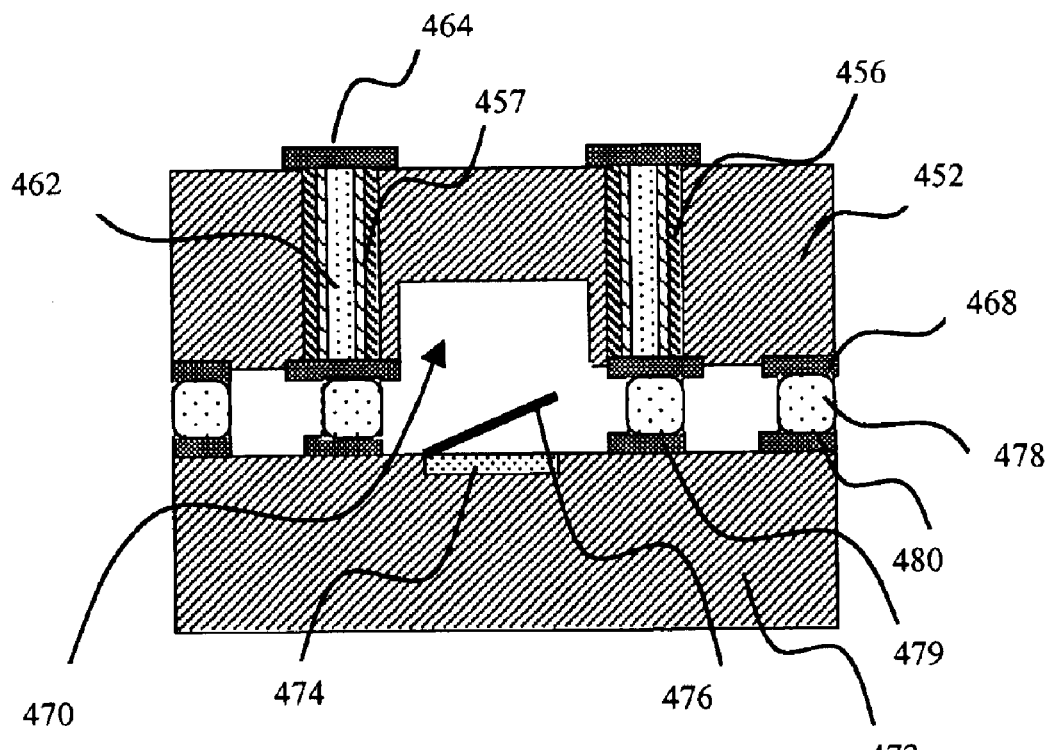

With reference to FIGS. 4A to 4F, other embodiments of the invention are described for a wafer-level MEMS packaging method and a wafer-level MEMS package. With reference to FIG. 4A, the wafer-level MEMS packaging method is described while with reference to FIGS. 4B to 4F, the processing of the wafer-level MEMS package is described.

In a Seed Layer Deposition step 402, a seed layer 458 is deposited on a cap wafer 452. The seed layer 458 can be a metal such as gold (Au) or copper (CU). Alternatively an UBM layer 458 can be deposited, which can be titanium (Ti), nickel (Ni) or gold (Au). If the seed layer 358 is deposited on the cap wafer 452, the seed layer 458 has to be removed after electroplating to fill the through-wafer vias 454 in the cap wafer 452 with a conductive material 462. Otherwise, the UBM layer 458 can be left on the cap wafer 452 for subsequent patterning to form pads on the cap wafer 452. Before the seed layer 458 is deposited on the cap wafer 452, a metal barrier 457 comprising of Titanium or Tantalum can be deposited on the cap wafer 452 for providing adhesion between the seed layer 458 and the cap wafer 452.

In a Via Etching step 404, the cap wafer 452 is processed in which the through-wafer vias 454 are etched using conventional etching process including DRIE or the like etching processes. A barrier layer 456/457, for example comprising a suitable silicon oxide barrier 456 and/or a metal barrier 457 like Titanium or Tantalum, depending on the application and specific requirement, is formed at the interface between the cap wafer 452 and the fill material for the through-wafer vias 454 using conventional barrier deposition or lithography and etching processes. The oxide barrier 456 provides insulation while the metal barrier 457 provides adhesion between the fill material and the through-wafer vias 454 and prevents diffusion of the fill material into the cap wafer 452. The aspect ratio of the through-wafer vias 454 can be high (>10) and the depth of the through-wafer vias 454, and thus the thickness of the cap wafer 452, can be >400 um. In this case, the seed layer or UBM layer 458 also acts as an etch-stop layer at which the etching of the through-wafer vias 454 stop.

In a subsequent Via Electroplating step 406, an electroplating process with the seed layer or UBM layer 458 acting as the electroplate is performed in which an electrolyte such as copper sulphate or the like electrolyte fills the through-wafer vias 454. After electroplating, a conductive material 462, such as copper (Cu), gold (Au) or nickel (Ni), is left in the through-wafer vias 454 forming vertical interconnects. The barrier layer 456 acts as a barrier preventing transmigration or diffusion of the conductive material 462 into the cap wafer 452.

In a Cap Wafer Processing step 408, if the seed layer 458 is not a UBM layer 458, then the seed layer 458 is removed by the conventional backgrinding and/or polishing processes, thereby exposing the conductive material 462. The side of the cap wafer 452 opposite the seed layer 458 is also backgrinded and/or polished to expose the conductive material 462. Thereafter, UBM layers are deposited on both sides of the cap wafer 452 and patterned to form interconnect pads 464 and 466, which are electrically interconnected via the conductive material 462, and bond pads 468 to facilitate bonding and stacking the cap wafer 452 with a MEMS wafer 472. The deposition and patterning of the UBM layers are performed using conventional techniques, which are followed by the etching of a MEMS cavity 470 on the same side of the cap wafer 452 having the bond pads 468.

If the seed layer 458 is a UBM layer 458, then the UBM layer 458 is left on the cap wafer 452 and patterned accordingly to form the interconnect pads 466 and the bond pads 468.

In a Package Integration step 410, the cap wafer 452 is solder bonded to the MEMS wafer 472 having a MEMS device 474 with a movable structure 476 using solder patterns 478 to form a wafer stack. Signals and electrical supply to the MEMS device 474 are conveyed to the MEMS device 474 via MEMS pads 479 formed on the MEMS wafer 472, which are congruent with and connected to the interconnect pads 466 on the cap wafer 452 using the solder patterns 478. Similarly, bond pads 480 formed on the MEMS wafer 472 are also congruent with and connected to the bond pads 468 formed on the cap wafer 452. Most importantly, the MEMS cavity 470 is congruent with the MEMS device 474 when superposed over the MEMS device 474 so that the movement of the movable structure 476 is unimpeded within the MEMS cavity 470. Alternatively, the cap wafer 452 may be bonded to the MEMS wafer 472 using a bonding material such as metal or solder suitable for thermocompression or the like compression processes instead of the solder patterns 478. To complete the wafer-level MEMS package, solder bumps are applied to the interconnect pads 464 and the wafer stack singulated. Alternatively, the solder bumps may be formed directly in place of the interconnect pads 464 formed during the Cap Wafer Processing step 408 by switching the electroplating solution and/or process after the electroplating process in the Via Electroplating step 406 to appropriately apply the solder bumps.

Figure 5A:
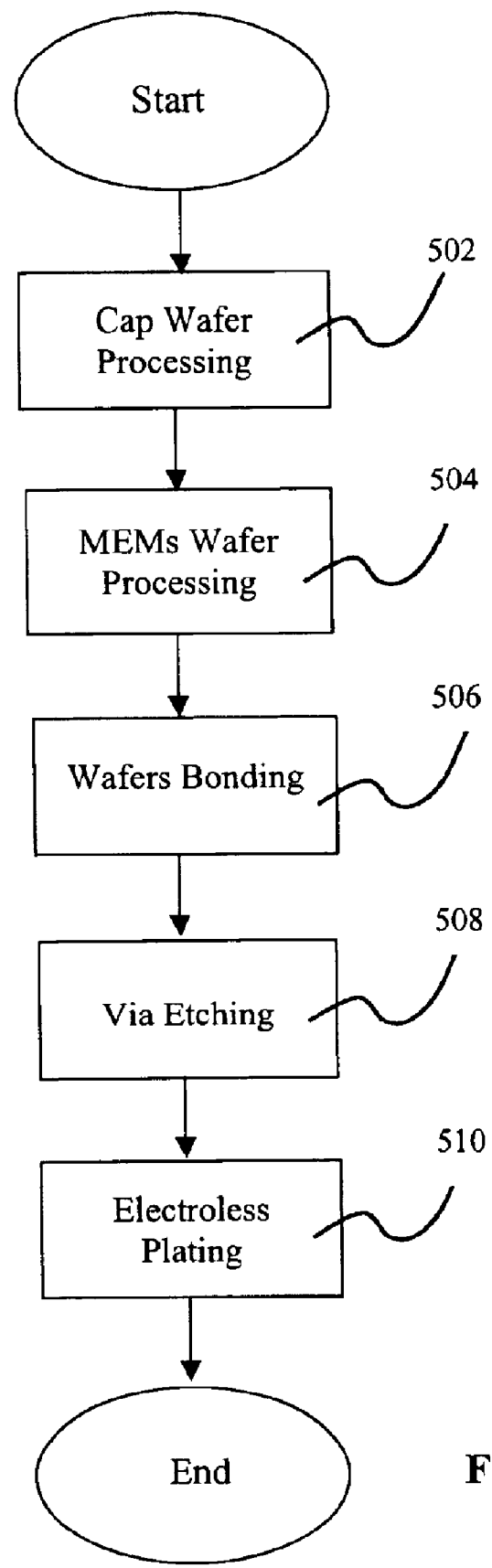
FIGS. 5A to 5F are diagrams illustrating a further method for wafer-level packaging and a device formed therefrom according to further embodiments of the invention.
Figure 5B:
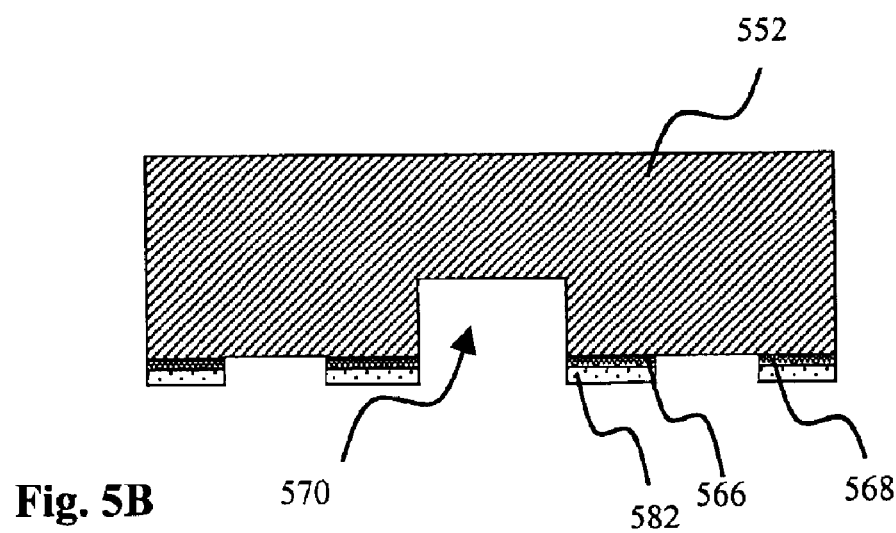
Figure 5C:
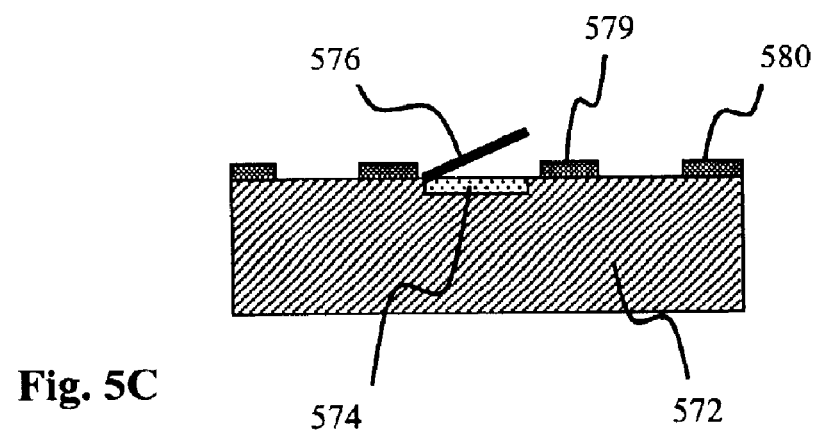
Figure 5D:
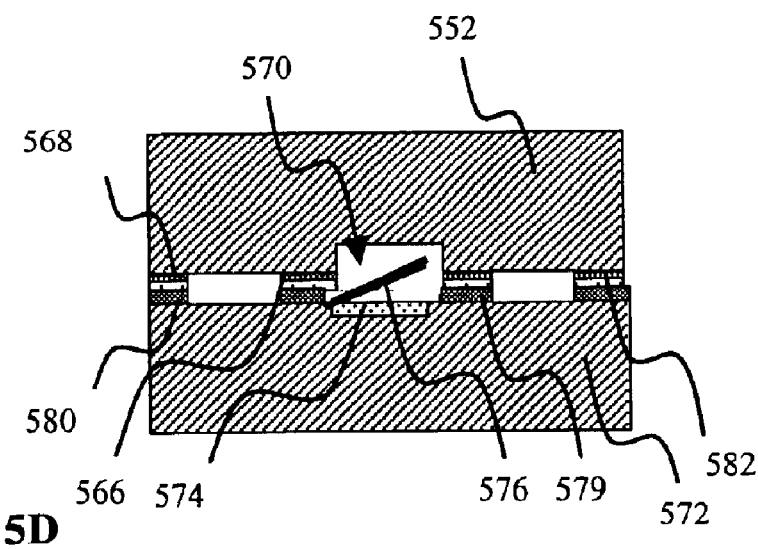
Figure 5E:
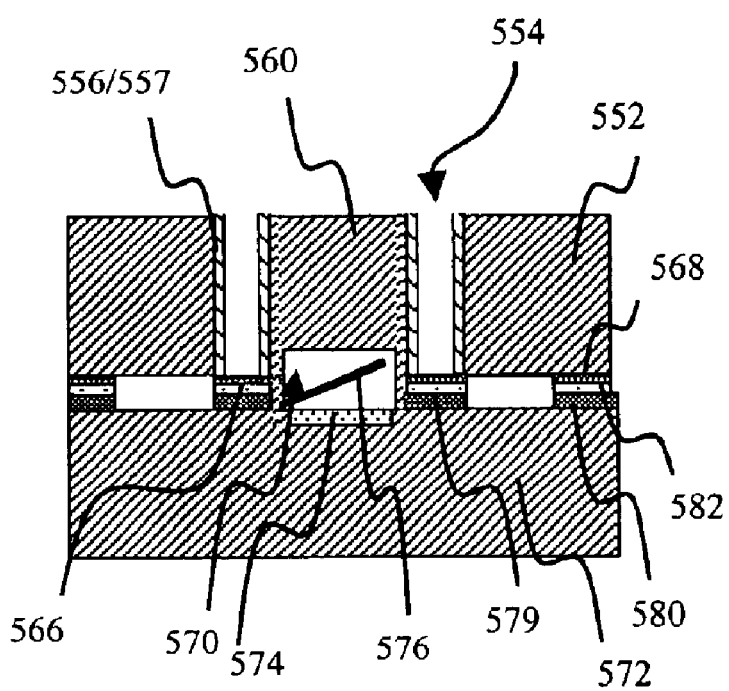
Figure 5F:
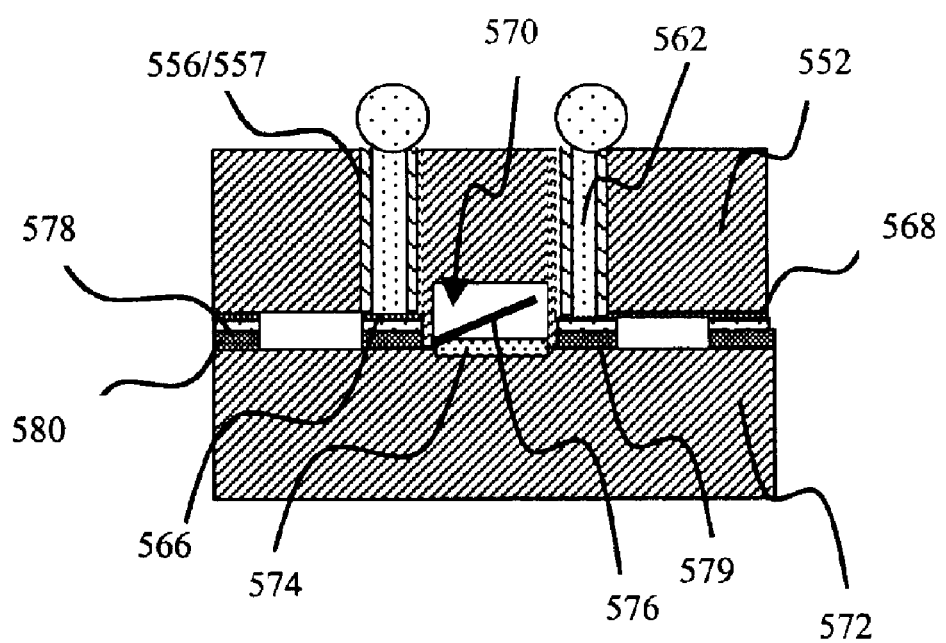

With reference to FIGS. 5A to 5F, further embodiments of the invention are described for a wafer-level MEMS packaging method and a wafer-level MEMS package. With reference to FIG. 5A, the wafer-level MEMS packaging method is described while with reference to FIGS. 5B to 5F, the processing of the wafer-level MEMS package is described.

In a Cap Wafer Processing step 502, a UBM layer is deposited on a cap wafer 552 and subsequently patterned to form interconnect pads 566 and bond pads 568. A layer of bonding material such as metal or solder is also deposited after the UBM layer and similarly patterned to form bonding patches 582. The bonding patches 582 are congruent with the interconnect pads 566 and the bond pads 568. The deposition and patterning of the UBM layer and the bonding layer are performed using conventional techniques, which are followed by the etching of a MEMS cavity 570 on the same side of the cap wafer 552 having the bond pads 568. The interconnect pads 566 serve to provide connection with MEMS pads 579 prepared on a MEMS wafer 572 and convey signals and electrical supply to a MEMS device 574 on the MEMS wafer 572 via the MEMS pads 579. The interconnect pads 566 through vertical interconnects in the cap wafer 552 in turn convey the signals and electrical supply outside the MEMS package. Such vertical interconnects are to be formed in the cap wafer 552 after the formation of through-hole vias 554 in the cap wafer 552 in a subsequent step. The bond pads 568 facilitate the bonding and stacking of the cap wafer 552 with a MEMS wafer 572.

In a MEMS Wafer Processing step 504, the MEMS pads 579 for the MEMS device 572 with a movable structure 576 and bond pads 580 are formed on the MEMS wafer 572. The MEMS pads 579 are congruent with the interconnect pads 566 on the cap wafer 552. Similarly, the bond pads 580 formed on the MEMS wafer 572 are also congruent with the bond pads 568 formed on the cap wafer 552.

In a Wafers Bonding step 506, the cap wafer 552 is bonded to the MEMS wafer 572 using thermocompression or the like compression processes to form a wafer stack. The MEMS pads 579 formed on the MEMS wafer 572, which are congruent with the interconnect pads 566 on the cap wafer 552, and the bond pads 580 formed on the MEMS wafer 572, which are also congruent with the bond pads 568 formed on the cap wafer 552, are bonded via the application of thermocompression on the bonding patches 568. Most importantly, the MEMS cavity 570 is congruent with the MEMS device 574 when superposed over the MEMS device 574 so that the movement of the movable structure 576 is unimpeded within the MEMS cavity 570. Alternatively, the cap wafer 552 may be bonded to the MEMS wafer 572 by a eutectic method such as solder-to-metal or metal-to-metal bonding instead of bonding patches 568.

In a Via Etching step 508, the cap wafer 552 is processed in which lithographically patterning is performed and the through-wafer vias 554 are etched using conventional etching process including DRIE or the like etching processes. The through-wafer vias 554 are formed in congruence with the interconnect pads 566. A barrier layer 556/557, for example comprising a suitable silicon oxide barrier and/or a metal barrier like Titanium or Tantalum, depending on the application and specific requirement, is formed at the interface between the cap wafer 552 and the fill material for the through-wafer vias 554 using conventional barrier deposition or lithography and etching processes. The oxide barrier provides insulation while the metal barrier provides adhesion between the fill material and the through-wafer vias 554 and prevents diffusion of the fill material into the cap wafer 552. The aspect ratio of the through-wafer vias 554 can be high (>10) and the depth of the through-wafer vias 554, and thus the thickness of the cap wafer 552, can be >400 um. In this case, the interconnect pads 566 act as an etch-stop layer at which the etching of the through-wafer vias 554 stop.

In an Electroless Plating step 510, an electroless plating process is performed to fill the through-wafer vias 554 with a conductive material 562 such as copper (Cu), gold (Au) or nickel (Ni), for forming the vertical interconnects. The electroless plating process is performed using conventional processes. To complete the wafer-level MEMS package solder bumps are formed over the filled through-wafer vias 554 by switching the electroplating solution and/or process after the electroplating process in the Via Electroplating step 508 to appropriately apply the solder bumps and the wafer stack singulated.

Figure 6A:
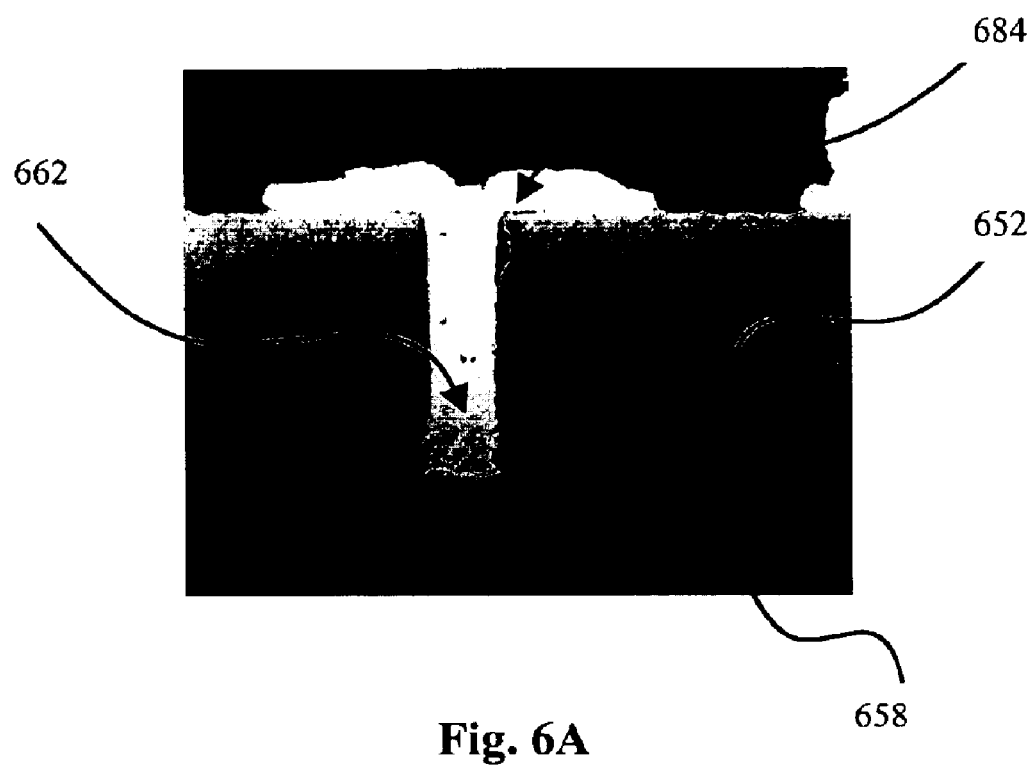
FIGS. 6A and 6B are diagrams illustrating results of vias formation during wafer-level packaging according to an embodiment of the invention.
Figure 6B:
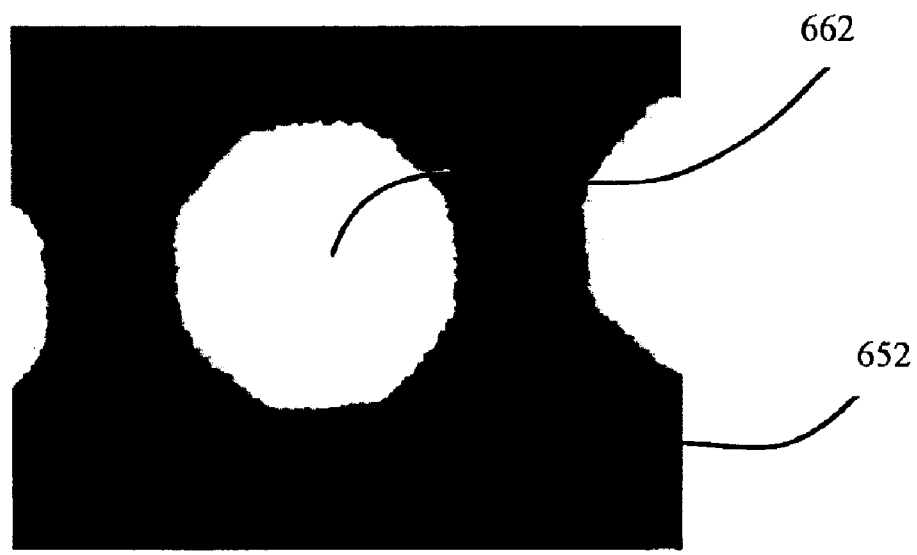

According to an embodiment of the invention, an experiment of a process of etching through-wafer vias in a cap wafer and subsequently filling these with metal by an electroplating process is conducted with the following conditions:

1. Seed metal used in the experiment: 0.5 um Au by KDF sputtering tool
2. Deep RIE etch done in STS by using the following process conditions:
3. Chamber pressure: 35–40 mtorr
4. ICP Coil power: 600 Watts
5. Platten power: 140 Watts
6. Etch process: BOSCH
7. Passivation gas: 130 sccm C4F8, 13 sec.
8. Etch gas: 100 seem $SF_6$, 9 sec.
9. Total process time: 2 hrs. for 400 um through hole etch.
10. Electroplating solution used: Copper sulphate
11. Seed metal: Au
12. Electroplating current: 300 mA The result of the experiment is illustrated with reference to FIGS. 6A and 6B, in which a through-wafer via 662 of 400 um depth in a wafer 652 after copper electroplating process from a seed layer is achieved. Minimal build-up 684 is created during the formation of the through-wafer via 662, which after backgrinding is flushed and therefore provides good planarity for the subsequent deposition of a pad or a solder bump. After electroplating, any sacrificial wafer and the seed layer is removed by wafer grinding and polishing processes. FIG. 6B shows the through-wafer via 662 after backgrinding and polishing.

Figure 7:
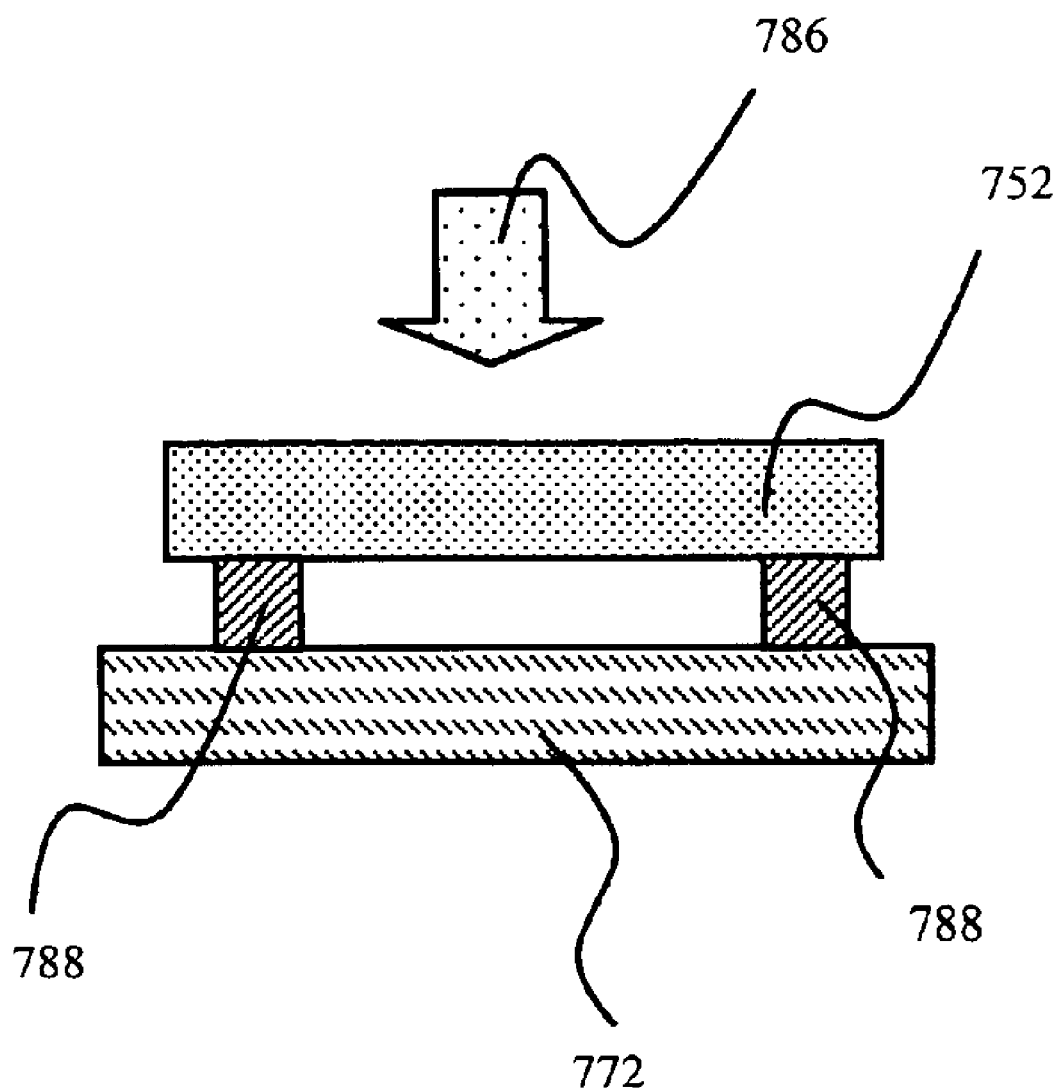
FIG. 7 is a diagram illustrating wafers stacking during wafer-level packaging according to an embodiment of the invention.

With reference to FIG. 7, a method of providing hermetic sealing for a wafer-level MEMS package according to an embodiment of the invention is illustrated. A cap wafer 752 and a MEMS wafer 772 may through thermocompression or the like compression processes 786 be hermetically sealed if a hermetically sealing material, such as Frit glass, is used in place of the solder patterns 378/478 or the bonding patches 582 used in the foregoing embodiments. In addition, the bonding pads 368/380/468/480/568/589 used in the foregoing embodiments have to be continuous pads encompassing the MEMS pads 379/479/579 so that when bonded therebetween using the hermetically sealing material form a gasket around the MEMS device.

In the foregoing manner, wafer-level packaging for micro-devices is described. Although only a number of embodiments of the invention are disclosed, it will be apparent to one skilled in the art in view of this disclosure that numerous changes and/or modification can be made without departing from the scope and spirit of the invention. For example, the foregoing wafer-level packaging methods may be applied to a 3-dimensional or 3-D package in which carrier wafers having micro-devices are stacked and a micro-device on one carrier wafer depends on through-wafer vias of adjacent carrier wafers to convey signals and electrical supply. Therefore instead of processing cap wafers, the wafer-level packaging may be applied to carrier wafers containing micro-devices.

What is claimed is:

1. A method for forming wafers having through-wafer vias for forming interconnects for wafer-level packaging of devices, the method comprising the steps of:
   depositing metal on one of two wafers;
   bonding the two wafers using the metal deposited on the one of the two wafers;
   forming a through-wafer via in one of the two wafers;
   filling the through-wafer via with a conductive material; and
   forming a cavity in the one of the two wafers having the through-wafer via, wherein the cavity is superposable over a device, wherein the conductive material first fills by one of electroplating and electroless plating the through-wafer via at the side of the one of the two wafers having the through-wafer via to which the other of the one of the two wafers is bondable.

2. The method as in claim 1, wherein the step of forming the through-wafer via comprises the step of etching the through-wafer via in the one of the two wafers.

3. The method as in claim 1, wherein the step of forming the cavity comprises the step of etching the cavity in the one of the two wafers having the through-wafer via.

4. The method as in claim 1, wherein the step of bonding the first wafer and the second wafer comprises the step of thermocompressing the two wafers.

5. The method as in claim 1, wherein the step of forming a cavity comprises the step of forming the cavity for superposing a MEMS device requiring unimpeded movement.

6. The method as in claim 5, wherein the step of forming a cavity further comprises the step of providing substantial clearance for enabling unimpeded movement of a moving structure of the MEMS device.

7. The method as in claim 1, wherein the step of bonding the two wafers is performed subsequent to the step of forming the through-wafer via in the one of the two wafers.

8. The method as in claim 7, wherein the step of forming the through-wafer via is performed on the one of the two wafers and the other of the two wafers is a sacrificial wafer.

9. The method as in claim 8, further comprising the step of removing the sacrificial wafer, which is performed subsequent to the step of filling the through-wafer via.

10. The method as in claim 7, wherein the step of forming the through-wafer via is performed on the one of the two wafers and the device is formable in the other of the two wafers.

11. The method as in claim 10, wherein the step of forming the cavity comprises the step of forming the cavity for superposing over the device formed in the other of the two wafers.

12. The method as in claim 1, wherein the step of bonding the two wafers is performed prior to the step of forming the through-wafer via in the one of the two wafers.

13. The method as in claim 12, wherein the step of forming the through-wafer via is performed on the one of the two wafers and the other of the two wafers is a sacrificial wafer.

14. The method as in claim 13, further comprising the step of removing the sacrificial wafer, which is performed subsequent to the step of filling the through-wafer via.

15. The method as in claim 12, wherein the step of forming the through-wafer via is performed on the one of the wafers and the device is formed in the other of the two wafers.

16. The method as in claim 15, wherein the step of forming the cavity comprises the step of forming the cavity for superposing over the device formed in the other of the two wafers.

17. A method for forming wafers having through-wafer vias for forming interconnects for wafer-level packaging of devices, the method comprising the steps of:
- depositing metal on one of two wafers;
- bonding the two wafers using the metal deposited on the one of the two wafers;
- forming a through-wafer via in one of the two wafers; and
- filling the through-wafer via with a conductive material wherein the conductive material first fills by one of electroplating and electroless plating the through-wafer via at the side of the one of the two wafers having the through-wafer via to which the other of the one of the two wafers is bondable.

18. The method as in claim 17, wherein the step of forming the through-wafer via comprises the step of forming the through-wafer via in a carrier wafer containing a device for providing a 3-dimensional package by stacking at least two carrier wafers.

* * * * *